United States Patent
Uhov et al.

(10) Patent No.: US 8,436,628 B2
(45) Date of Patent: May 7, 2013

(54) DOOR POSITION SENSOR

(75) Inventors: Andrei Uhov, St. Petersburg (RU); Roberto Giordano, Pozzuolo del Fruili UD (IT); Girish Pimputkar, Stockholm (SE)

(73) Assignee: Electrolux Home Products Corporation N.V., Zaventem (BE)

( * ) Notice: Subject to any disclaimer, the term of this patent is extended or adjusted under 35 U.S.C. 154(b) by 616 days.

(21) Appl. No.: 12/282,392

(22) PCT Filed: Mar. 15, 2007

(86) PCT No.: PCT/SE2007/000258
§ 371 (c)(1), (2), (4) Date: Nov. 5, 2008

(87) PCT Pub. No.: WO2007/108746
PCT Pub. Date: Sep. 27, 2007

(65) Prior Publication Data
US 2009/0072884 A1  Mar. 19, 2009

(30) Foreign Application Priority Data
Mar. 17, 2006 (SE) ........................ 0600617

(51) Int. Cl.
*G01R 27/26* (2006.01)

(52) U.S. Cl.
USPC ........... 324/661; 324/658; 324/659; 324/660; 340/545.6; 340/545.1

(58) Field of Classification Search ............... 340/545.1, 340/545.4, 562; 324/661
See application file for complete search history.

(56) References Cited

U.S. PATENT DOCUMENTS

| | | | |
|---|---|---|---|
| 4,241,337 A * | 12/1980 | Prada | 340/547 |
| 4,453,112 A | 6/1984 | Sauer et al. | |
| 4,691,195 A | 9/1987 | Sigelman et al. | |
| 5,479,152 A * | 12/1995 | Walker et al. | 340/545.6 |
| 5,621,290 A | 4/1997 | Heller et al. | |
| 5,730,165 A | 3/1998 | Philipp | |
| 5,802,479 A | 9/1998 | Kithil et al. | |
| 5,942,974 A * | 8/1999 | Pfreundschuh et al. | 340/545.6 |
| 6,160,370 A | 12/2000 | Ohnuma | |

(Continued)

FOREIGN PATENT DOCUMENTS

GB 2243217 A 10/1991
JP 3-500598 2/1991

(Continued)

OTHER PUBLICATIONS

International Search Report for PCT/SE2005/001325 dated Dec. 9, 2005.

(Continued)

*Primary Examiner* — Richard Isla Rodas
(74) *Attorney, Agent, or Firm* — Pearne & Gordon LLP

(57) ABSTRACT

The present invention relates to a capacitive sensor system comprising a sensor circuit connected to a first (15) and a second (11) antenna, the first antenna (15) is arranged on a first object (10) and the second antenna (11) is arranged on a second object (11) movable relative to said first object (10). The first antenna (15) is arranged right next to the second object (11) for the sensor circuit to detect the movement and/or position of the second object (11).

17 Claims, 4 Drawing Sheets

U.S. PATENT DOCUMENTS

| | | |
|---|---|---|
| 6,348,862 B1 | 2/2002 | McDonnell |
| 6,377,009 B1 | 4/2002 | Philipp |
| 6,724,324 B1 | 4/2004 | Lambert |
| 2003/0085679 A1 | 5/2003 | Bledin et al. |
| 2008/0204047 A1 | 8/2008 | Wern et al. |

FOREIGN PATENT DOCUMENTS

| | | |
|---|---|---|
| JP | 2000-180032 A | 6/2000 |
| JP | 2003-166369 A | 6/2003 |
| WO | 89/08952 A1 | 9/1989 |
| WO | 02/089328 A1 | 11/2002 |
| WO | 03/069104 A1 | 8/2003 |
| WO | 2004-031520 A1 | 4/2004 |
| WO | 2006/031185 A1 | 3/2006 |
| WO | WO 2006031185 A1 * | 3/2006 |

OTHER PUBLICATIONS

International Search Report for International application No. PCT/SE2007/000258 dated Jun. 14, 2007, 1 page.

Japanese Office action for 2007-532284, dated Apr. 5, 2011.

* cited by examiner

DOOR POSITION SENSOR

TECHNICAL FIELD

The present invention relates to a capacitive sensor system comprising a sensor circuit connected to a first and a second antenna, the first antenna is arranged on a first object and the second antenna is arranged on a second object movable relative to said first object.

BACKGROUND

Capacitive sensor systems are well known for their capability of providing control and operation of different appliances based on the presence of a human body. Such systems in general are for instance described in U.S. Pat. No. 4,453,112 and U.S. Pat. No. 5,621,290. In these documents a sensor electrode is arranged on the window frame of a car window. As soon as a portion of a human body, such as a hand, approaches the sensor electrode, the capacitance between the sensor electrode and an earth electrode increases. This increase in capacitance changes the frequency of an output signal of the electrode, which is compared to a reference, and a motor moving the window operates based on this change. The sensor system can respond to semi-conductive elements such as a human body, but plastics and wood will not cause any effect.

The not yet published Swedish patent application SE 0402261-2 discloses a capacitive sensing system provided to solve the problem of detecting a small body part between the door and the body of a refrigerator cabinet equipped with a capacitive sensing system. Normally, the cabinet body will make the door antenna blind since its major influence on the capacitance is much larger that the smaller influence on the capacitance caused by the body part. To solve this, the disclosed invention comprises an electromagnetic shield between the door and the fridge body, mounted like a gasket at the edge of the cabinet body. The shield should remove the influence caused by the cabinet body. This shield has fixed position relative to the fridge body and a constant capacitance in relation to it. The door is electrically connected to this shield and the movement of the door process does not change the door capacitance to the fridge body.

However, one disadvantage with the disclosed system is the high construction cost. This frame should be thin conductive foil (cupper for example) but from aesthetic point of view it should be covered by some plastic elements and all sides of this frame should be electrically connected to each other and to the control board. When closed the door cover frame elements influence the gasket with big pressure and plastic need to be hard enough (expensive) to survive in this conditions.

Another problem is that the frame is not a real shield. The size of the door (see FIG. 1) is much bigger than the total area of the frame. This means that an electromagnetic field C3 is formed between the door and the fridge body. This will add an extra, varying capacitance to the measurement circuit of the system. In fact, the shield (since it is not a real shield) could be replaced by "normal" constant capacitor C1 located on the control board. Then we are back to a capacitive sensing system for a refrigerator cabinet without a shield. The capacitance C3 will depend on the door angle and influence the total capacitance of said circuit (see FIG. 2). Moreover, because the frame is much closer to the fridge body, its capacitance C1 is much higher (about 2-3 nF and it's mean 10 times bigger than the human body to door's capacitance, C2).

We will therefore have not only one constant capacitance of the shield to body, but two capacitors C1,C3 connected in parallel—frame to the fridge and door to the fridge with a total capacitance 10 times higher than human body to door (C2). FIG. 1-2 illustrates this. Moreover, we have to deal with the C3 variances because of the door angle. Because of this we will need a high-resolution ADC (dynamic range about 20 000) and complicated signal processing with amplifying only a part of a signal within full range to be able to detect a human body movement. The problem will be to identify if a variation in total capacitance depends on a door movement or a human body presence.

SUMMARY OF THE PRESENT INVENTION

It is therefore an object of the present invention to provide a capacitive sensor system, applied on a door or lid held by a capacitance-influenced frame, which is able to easily and reliably detect a small portion of a human body. This object is achieved according to the invention as defined in the characterizing portion of claim 1.

DESCRIPTION OF THE DRAWINGS

The invention will now be described further with reference to the accompanying drawings, in which.

DESCRIPTION OF AN ILLUSTRATIVE EMBODIMENT

Figure 1:
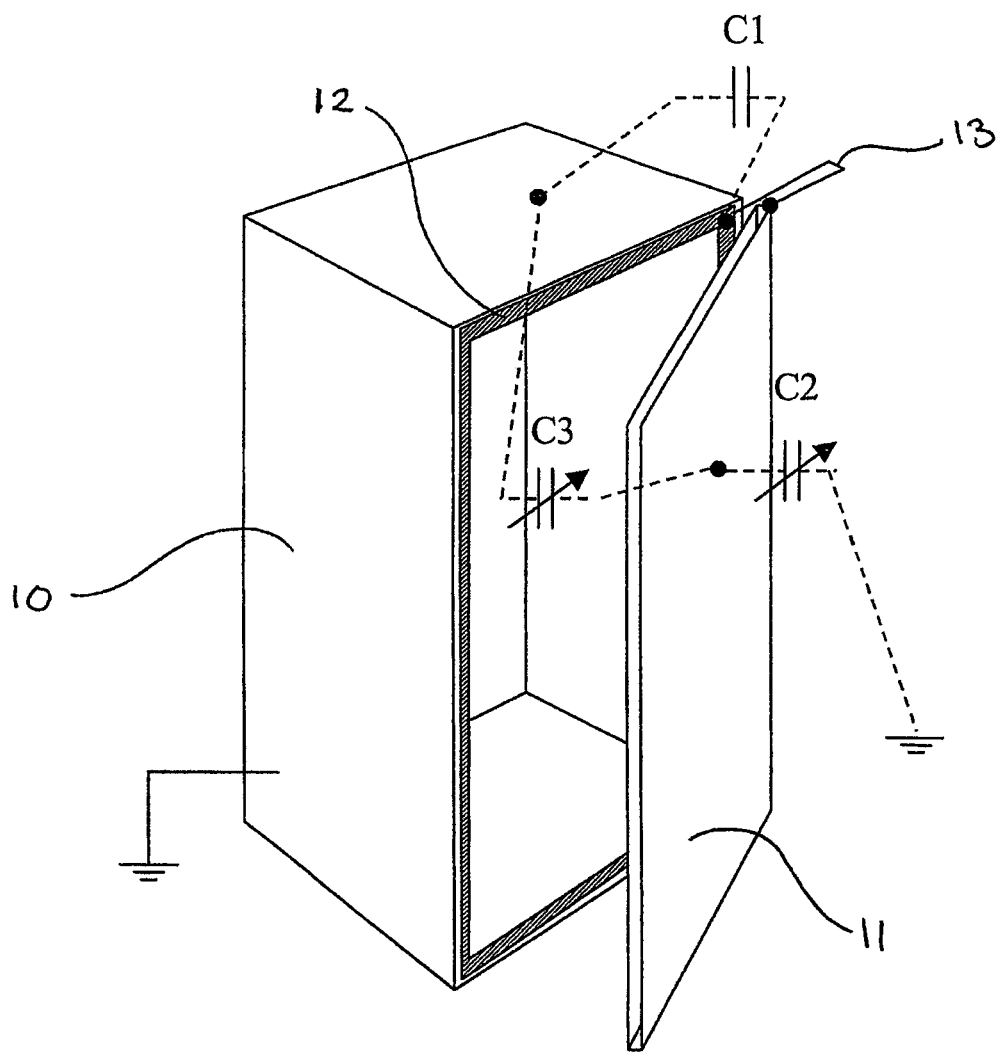
FIG. 1 shows the prior art capacitive sensing system applied to a refrigerator cabinet
Figure 2:
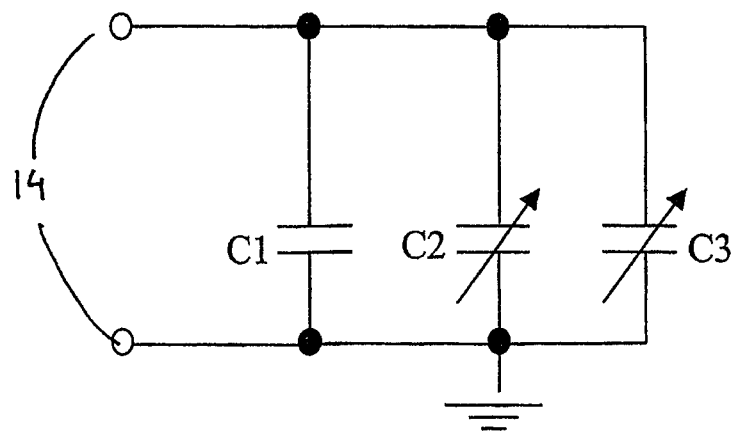
FIG. 2 shows the corresponding measurement circuit for the system according to FIG. 1

The FIGS. 1-2 show the prior art embodiment in the non-published Swedish patent application SE 0402261-2, while FIG. 3-6 shows an illustrative embodiment of a capacitive sensor system in accordance with the present invention. The illustrative embodiment shall not be interpreted as a limitation of the invention. Its purpose is to illustrate how the invention can be applied and to further illustrate the scope of the invention.

Referring to FIG. 1 the prior art capacitive sensing system is applied to a refrigerator cabinet 10 having a body with an outer metal sheet enclosing the cabinet. The cabinet comprises a door 11 hanged by hinges to the body. As described in the background, this system comprises an electromagnetic shield 12 between the door and the fridge body, mounted like a gasket at the edge of the cabinet body. It is coupled 13 to the door. The shield should remove the influence caused by the cabinet body. FIG. 2 shows the corresponding measurement circuit (currents summarizing) formed by this arrangement, which in turn corresponds to the following calculation of the total capacitance:

$$C_{tot} = C1 + C2 + C3$$

C1 is the fixed capacitance formed between the shield and the cabinet body. This has a high value (nF). C2 is the variable capacitance formed between the door and the ground level, which depends on the human body's movement or presence at the door. This has a low value (pF). C3 is the uncalculated, variable capacitance formed between the door and the cabinet body. It has a high value (nF) and depends on the door's opening angle. When measuring the total capacitance on the output 14 (FIG. 2) it will be very difficult to identify a human body movement (C2 variations). The problem will be to identify if a variation in total capacitance depends on a door movement or a human body presence.

Figure 3:
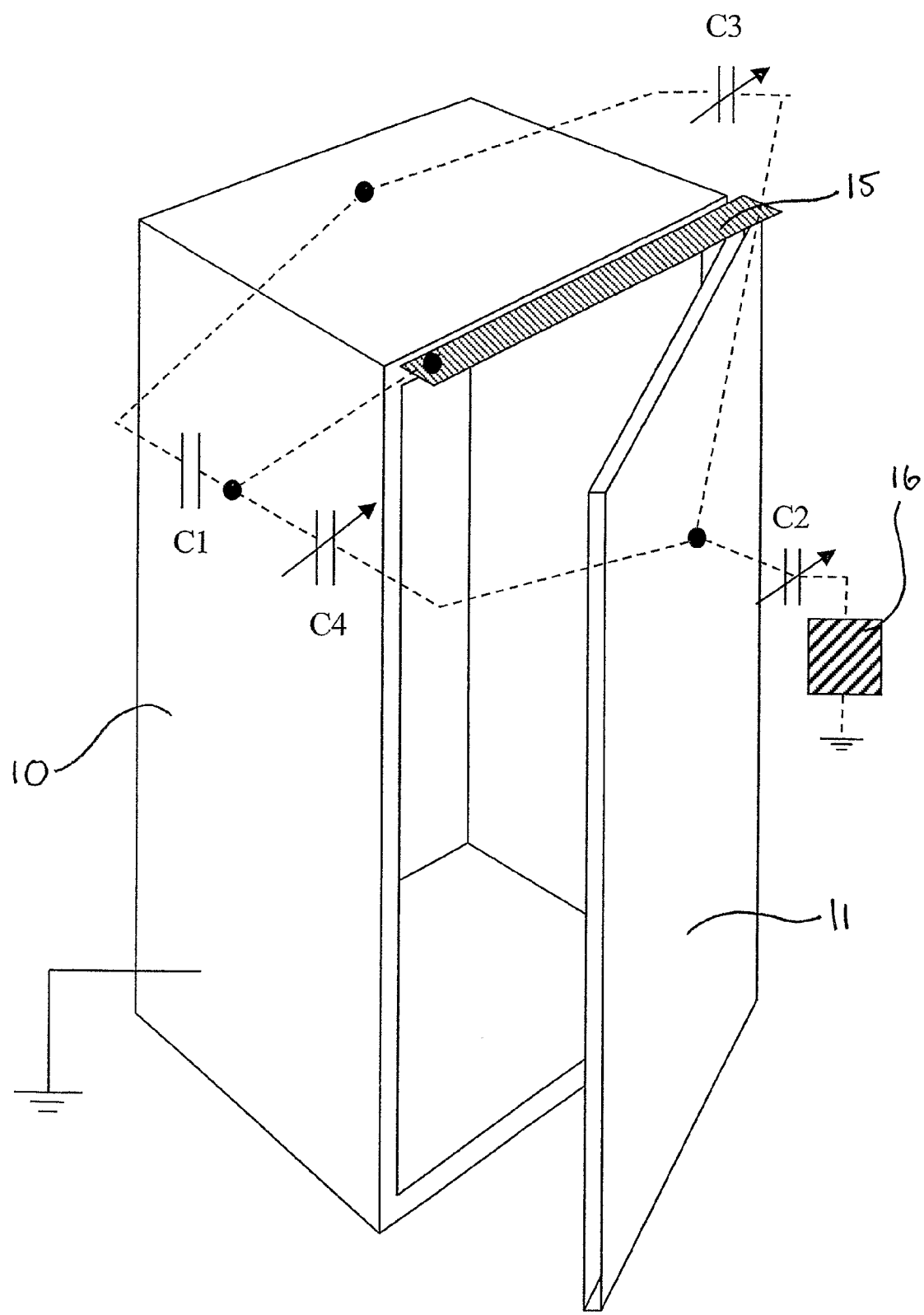
FIG. 3 shows a capacitive sensing system applied to a refrigerator cabinet according to the present invention.

FIG. 3-6 shows an illustrative embodiment according to the present invention. In FIG. 3 the cabinet 10 with the hinged door 11 is shown. An outer metal sheet covers the cabinet body. According to the present invention, the shield 12 is replaced by an electrode 15 on the top side of the fridge. The electrode is made as a metal strip arranged on the top panel (not shown) holding the user interface, the circuit board and other electric components. The electrode will operate as an antenna for the capacitive sensing circuit. The system will be able to detect the door position as a way of solving the above-mentioned problems with the prior art solution.

In FIG. 3 the capacitors formed by the new system arrangement are shown. C1 is the fixed capacitance formed between the electrode 15 and the cabinet body 10. C2 is the variable capacitance formed between the door and the ground level, which depends on the presence or movement of a human body near the door. C3 is the variable capacitance formed between the door and the cabinet body. It depends on the door's opening angle. C4 is the variable capacitance formed between the electrode and the door. It depends on the door's opening angle. As described later, the system will use the knowledge about the value of this capacitance C4 to detect if a human body 16 approaches the door.

Figure 4:
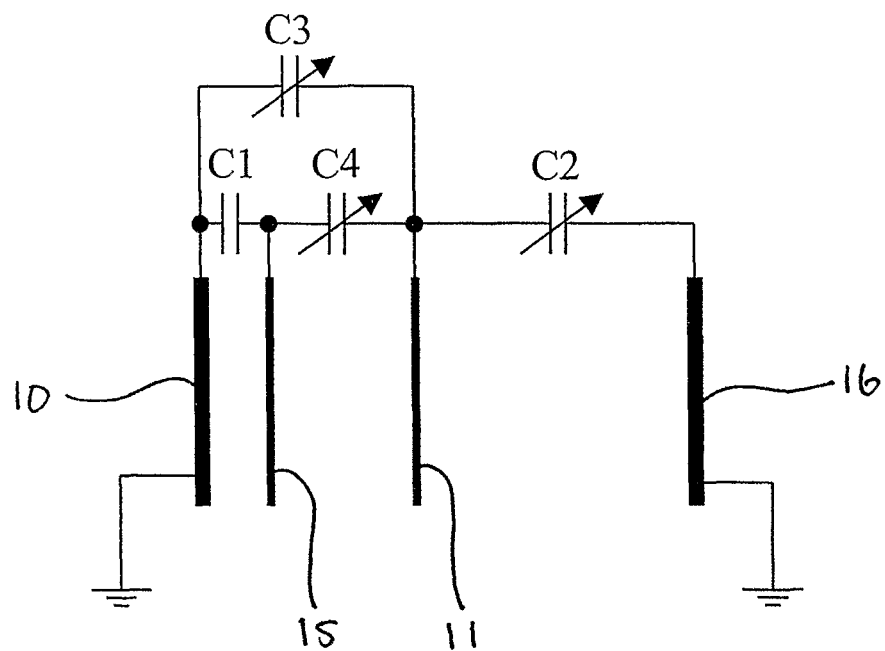
FIG. 4 shows the measurement system element structure for the system according to FIG. 3.
Figure 5:
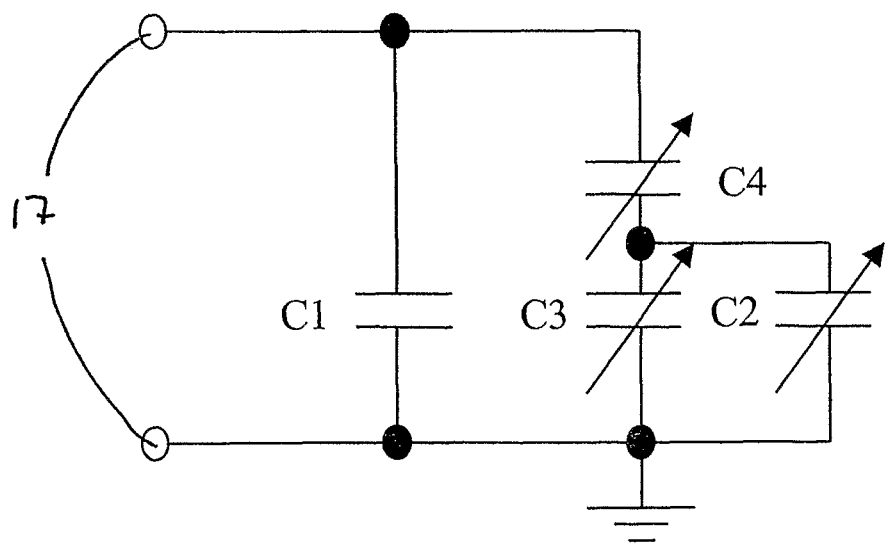
FIG. 5 shows the corresponding measurement circuit for the system according to FIG. 3-4.

FIG. 4 shows the measurement system element structure and FIG. 5 the corresponding measurement circuit for the present capacitive sensing system. FIG. 4 shows the different antennas (cabinet body 10, electrode 15, door 11, human body 16) which influences the total capacitance measured on the output 17 of the circuit (FIG. 5). Now looking into the calculation of the total capacitance on the output 17:

$$C_{tot}=C1+1/(1/C4+1/(C2+C3))$$

In the present invention values of the electrode capacitance (C1 and C4) are much lower (less than 10 pF) comparing with door and human body capacitances C2/C3, (200-400 pF in total) and influence of the C2 and C3 on the metal strip capacitance is therefore not significant, for example:
If C1=10 pF, C4=10 pF; C3=300 pF, C2=100 pF (user touches a door). The total capacitance is then:

$$C=C1+1/(1/C4+1/(C2+C3))=10+1/(1/10+1/(300+100))$$
$$=19.76 \text{ pF}$$

If C1=10 pF, C4=10 pF; C3=300 pF, C2=0 pF (user far from door). The total capacitance is then:

$$C=C1+1/(1/C4+1/(C2+C3))=10+1/(1/10+1/(300+0))$$
$$=19.67 \text{ pF}$$

So human body movement close to the door and even door touching will not have real influence on the door position measurement results (especially when is door open and capacitance C4 is significantly less).

Figure 6:
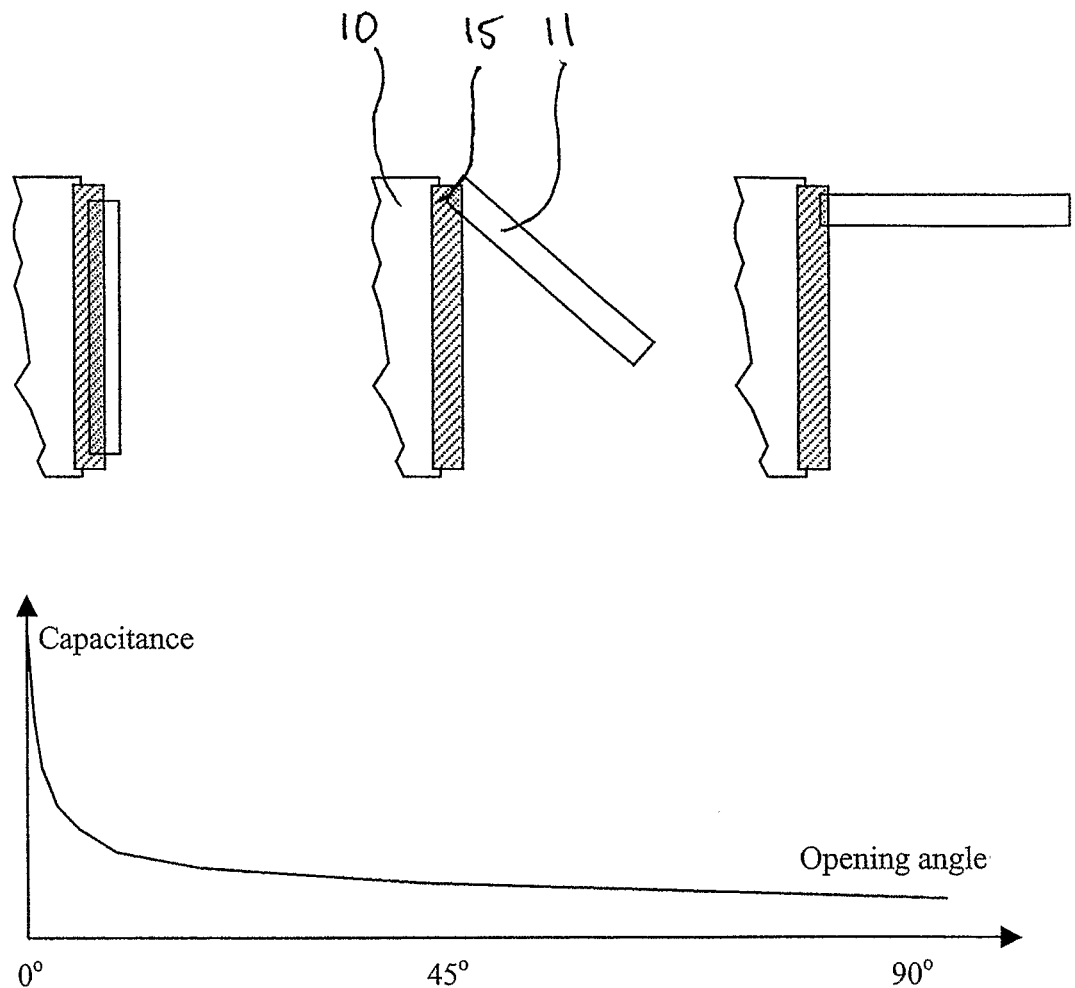
FIG. 6 shows the "door opening angle dependent capacitance".

Looking into FIG. 6, when the door is opening its position under the top side metal strip is changing and the area of the common covering surfaces is also changing. Capacitance of this variable capacitor will therefore depend (but not linear) on opening angle, se the diagram. Biggest part of the changes will take a place when door only starts opening and will very small when door will almost opened. This sensor will have very good precision for determination door close condition and low precision for door open condition. For fridge proper functionality door close condition reliable identification is more critical than open so not very good precision for open condition are acceptable.

The outcome of this is that it will be easy, when starting the system to calibrate so that the system knows the total capacitance at output 17 for different door angles. The user will be instructed to do this calibration when installing the cabinet into their home. Then the system will always have information about door position and can calculate the expected total capacitive signal for a certain door angle without user actions (movement and door touching) and subtract it from real signal. We will thereby have a pure user actions signal. This will enable a working capacitive sensing system for a refrigerator cabinet.

Practically, the capacitive sensor circuit will, when calibrated, detect the position of the second object by measuring the total capacitance in the electrical circuit and compare it with a stored diagram of the relationship between total capacitance and the position of the second object. The sensor circuit will, when having detected the position of the second object, detect the movement and/or position of a used body part next to the second object.

Another advantage is that the two mechanical switches normally used in refrigerators (door open alarm switch and internal lighting switch) can be removed. Expected cost reduction due to mechanical construction simplification.

It is obvious for the person skilled in the art that the invention is not restricted to a capacitive sensor system adapted only for a cooling cabinet. Instead it can be used in any appliance having a moving part in which an antenna device for a capacitive sensing system is implemented.

The invention claimed is:

1. Capacitive sensor system comprising a sensor circuit operationally connected to a first (15) and a second (11) antenna, the first antenna (15) arranged on a first object (10) and the second antenna (11) arranged on a second object (11) movable relative to said first object (10),
    wherein the first antenna (15) is arranged right next to the second object (11) for the sensor circuit to detect a movement and/or position of the second object (11) and arranged in such a way that a variable capacitance is formed between the first antenna and the second antenna such that a human body movement close to the second antenna has little or no influence on object position measurement results of the sensor circuit,
    wherein the sensor circuit detects the movement and/or position of the second object (11) by comparing a measured capacitance with a stored relationship between capacitances and a plurality of respective different open positions of the second object (11),
    wherein the second object (11) is a door rotatably or slideably mounted on the first object (10), and the second antenna (11) is formed as a cover sheet on the door, and
    wherein the first antenna (15) extends from the first object (10) so as to extend over an end face of the door.

2. Capacitive sensor system according to claim 1 wherein the first antenna (15) is arranged substantially in parallel with a surface on the second object (11).

3. Capacitive sensor system according to claim 2 wherein the first antenna (15) and said surface on the second object (11) at least partly overlap when looking at the surface perpendicularly.

4. Capacitive sensor system according to claim 2 wherein both the first antenna (15) and said surface on the second object (11) have an oblong shape, wherein main extension directions for both the antenna (15) and the surface are substantially parallel at one position of the second object (11).

5. Capacitive sensor system according to claim 2 wherein the first object (10) is a cabinet body, and the body together with the door enclose a cabinet space, the first antenna (15) being arranged at an antenna surface facing said surface on the second object (11).

6. Capacitive sensor system according to claim 5 wherein the antenna surface is arranged on an extended portion of the cabinet body so as to face the end face.

7. Capacitive sensor system according to claim 1 wherein the second antenna (11) is arranged for the sensor circuit to detect a movement and/or position of a user body part (16) next to the second object (11).

8. Capacitive sensor system according to claim 1 wherein a first capacitance (C1) is formed between the first antenna (15) and the first object (10).

9. Capacitive sensor system according to claim 8 wherein a second capacitance (C2) is formed between the second antenna (11) and ground level.

10. Capacitive sensor system according to claim 9 wherein a third capacitance (C3) is formed between the second antenna (11) and the first object (10).

11. Capacitive sensor system according to claim 10 wherein a fourth capacitance (C4) is formed between the first antenna (15) and the second antenna (11).

12. Capacitive sensor system according to claim 11 wherein the value of the fourth capacitance (C4) is influenced by said movement of the second object (11) in relation to the first object (10).

13. Capacitive sensor system according to claim 9 wherein the value of the second capacitance (C2) is influenced by presence of the human body (16) at the second object (11).

14. Capacitive sensor system according to claim 1 wherein the sensor circuit detects the position of the second object from a capacitance measurement of a variable total capacitance, said variable total capacitance including the variable capacitance formed between the first antenna and the second antenna.

15. Capacitive sensor system according to claim 1, wherein the stored relationship between capacitances and the plurality of respective different open positions of the second object (11) comprises a stored diagram of said relationship.

16. Method for a capacitive sensor system comprising a sensor circuit operationally connected to a first (15) and a second (11) antenna, the first antenna (15) arranged on a first object (10) and the second antenna (11) arranged on a second object (11) movable relative to said first object (10), the arrangement of antennas forming an equivalent electrical circuit, wherein the sensor circuit detects a position of the second object (11) by measuring a total capacitance (17) in the electrical circuit and comparing it with a stored diagram of a relationship between total capacitance and the position of the second object (11), wherein the first antenna and the second antenna are arranged in such a way that a variable capacitance is formed between the first antenna and the second antenna such that a human body movement close to the second antenna has little or no influence on object position measurement results of the sensor circuit, and wherein said total capacitance includes the variable capacitance formed between the first antenna and the second antenna, wherein the second object (11) is a door rotatable mounted on the first object (10) and the position of the second object (11) corresponds to a rotation angle of the second object (11) in relation to the first object (10), and wherein the first antenna (15) extends from the first object (10) so as to extend over an end face of the door.

17. Method according to claim 16 wherein the sensor circuit when having detected the position of the second object (11) is able to detect a movement and/or position of a user body part next to the second object (11).

* * * * *

UNITED STATES PATENT AND TRADEMARK OFFICE
CERTIFICATE OF CORRECTION

PATENT NO.        : 8,436,628 B2                                        Page 1 of 1
APPLICATION NO.   : 12/282392
DATED             : May 7, 2013
INVENTOR(S)       : Uhov et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 777 days.

Signed and Sealed this
Eighth Day of September, 2015

Michelle K. Lee
*Director of the United States Patent and Trademark Office*